US007388959B2

(12) United States Patent
Gagon

(10) Patent No.: US 7,388,959 B2
(45) Date of Patent: Jun. 17, 2008

(54) HARMONIC GENERATOR AND PRE-AMP

(75) Inventor: Paul R. Gagon, Huntington Beach, CA (US)

(73) Assignee: BBE Sound, Inc., Huntington Beach, CA (US)

( * ) Notice: Subject to any disclaimer, the term of this patent is extended or adjusted under 35 U.S.C. 154(b) by 408 days.

(21) Appl. No.: 10/923,461

(22) Filed: Aug. 20, 2004

(65) Prior Publication Data

US 2005/0041821 A1 Feb. 24, 2005

Related U.S. Application Data

(60) Provisional application No. 60/497,095, filed on Aug. 22, 2003.

(51) Int. Cl.

| | |
|---|---|
| ***H03G 5/00*** | (2006.01) |
| ***H03G 3/00*** | (2006.01) |
| ***H03G 5/02*** | (2006.01) |
| ***H03F 3/38*** | (2006.01) |
| ***H03F 3/45*** | (2006.01) |
| ***H03F 3/68*** | (2006.01) |
| ***H03F 21/00*** | (2006.01) |
| ***H04L 25/03*** | (2006.01) |
| ***H04R 5/00*** | (2006.01) |

(52) U.S. Cl. ............................ 381/98; 381/61; 381/63; 381/106; 381/103; 381/1; 381/120; 330/10; 330/69; 330/126; 333/28 T; 333/28 R

(58) Field of Classification Search .................. 381/61, 381/63, 98, 103, 106, 1, 120; 330/126, 10, 330/69; 333/28 T, 28 R See application file for complete search history.

(56) References Cited

U.S. PATENT DOCUMENTS

| | | | |
|---|---|---|---|
| 4,638,258 A | 1/1987 | Crooks | |
| 4,672,671 A * | 6/1987 | Kennedy | 381/61 |
| 5,032,796 A | 7/1991 | Tiers et al. | |
| 5,510,752 A * | 4/1996 | Gagon | 330/126 |
| 5,736,897 A | 4/1998 | Gagon | |
| 5,737,432 A * | 4/1998 | Werrbach | 381/94.1 |

(Continued)

OTHER PUBLICATIONS

PCT International Search Report dated Mar. 20, 2006 for PCT/US2005/27487.

Frank P. Tedeschi, The Active Filter Handbook, p. 178-182, TAB Books Inc, 1979.

*Primary Examiner*—Vivian Chin
*Assistant Examiner*—Devona E Faulk
(74) *Attorney, Agent, or Firm*—Foley & Lardner LLP

(57) ABSTRACT

A Harmonic Generator for audio applications and a Pre-Amplifier circuit are combined to form a Harmonic Generator and Pre-Amplifier circuit. The Harmonic Generator is formed from a Buffer Circuit responsive to an input program signal for buffering the input program signal and for providing a buffered input program signal. A Modulator Circuit is coupled to receive the buffered input program signal and generates harmonics in response to changes in amplitude of the program input signal to provide a modulated input program signal. A Summing Circuit adds the buffered input program signal and the modulated input program signal to provide a composite modulated input program signal. The Pre-Amplifier is coupled to receive the composite modulated input programing signal and process the signal in three audio frequency bands to provide a compensated output signal that includes harmonics generated by the modulator.

18 Claims, 4 Drawing Sheets

U.S. PATENT DOCUMENTS 6,111,961 A * 8/2000 Hedrick et al. ............... 381/61
6,275,593 B1 8/2001 Garcia et al.
6,845,165 B1 * 1/2005 Motohashi et al. ........... 381/98
7,054,455 B2 * 5/2006 Aarts .......................... 381/98
2003/0044023 A1 3/2003 Larsen
2003/0044024 A1 * 3/2003 Aarts et al. ................... 381/61

* cited by examiner

HARMONIC GENERATOR AND PRE-AMP

CROSS REFERENCE TO RELATED APPLICATIONS

This application claims benefit from and is a non-provisional filing based upon the prior provisional application Ser. No. 60/497,095 filed Aug. 22, 2003.

FIELD OF THE INVENTION

This invention relates to the field of electronic amplifiers and more particularly to the field of signal conditioning circuits used in audio amplifiers for the purpose of reproducing music and delivering it to a speaker or other reproduction means.

This application provides information that relates to and extends the subject mater found in Ser. No. 08/377,903 filed Jan. 24, 1995 for "A LOW INPUT SIGNAL BANDWIDTH COMPRESSOR AND AMPLIFIER CONTROL CIRCUIT" which issued on Apr. 23, 1996 as U.S. Pat. No. 5,510,752; and, to Ser. No. 09/636,168 filed Apr. 22, 1996 for "A LOW INPUT SIGNAL BANDWIDTH COMPRESSOR AND AMPLIFIER CONTROL CIRCUIT WITH A STATE VARIABLE PRE-AMPLIFIER" which issued on Apr. 7, 1998 as U.S. Pat. No. 5,736,897"; and, Ser. No. 09/444,541 filed Nov. 22, 1999 for "AN AUDIO BOOST CIRCUT", all of which have a common inventor and assignee. Each of the applications mentioned herein are incorporated herein by reference in their entirety.

BACKGROUND OF THE INVENTION

The above referenced issued U.S. Pat. No. 5,736,897 shows a state-variable filter used as a Pre-Amplifier that receives an input program signal and processes the input program signal to provide three band-pass signals comprising a low band-pass signal (LFRCMIPS), a mid-range band pass signal (MFRCMIPS) and a high band-pass signal (HFRCMIPS) to respective inputs of a summing amplifier. The three signal components are then summed and output as a compensated signal at its output. The '897' Patent then shows the compensated signal being processed by a "Compander" Circuit first introduced in the above referenced U.S. Pat. No. 5,510,752. Application Ser. No. 09/444,541 referenced above shows the compensated signal at the output of the state-variable filter driving an audio boost circuit.

The compensated signal is free of harmonic distortion in each of the above mentioned topologies. A determination has been made that some applications benefit from the introduction of a predetermined amount of harmonic distortion into the compensated signal out of the pre amplifier. This application provides an initial input amplifier that receives the program signal and provides a buffered program signal. The buffered program signal is sampled by a Harmonic Generator circuit. The Harmonic Generator circuit then generates a family of harmonic signals that are summed with the buffered program signal for cumulative processing by the state variable filter to provide a composite compensated signal having a predetermined component of harmonics.

SUMMARY OF THE INVENTION

The above-noted problems, and others, are overcome in accordance with this invention using a Harmonic Generator for audio applications and a Pre-Amplifier circuit formed from a Buffer Circuit coupled to an IPS (input program signal) for buffering the input program signal to provide a BIPS (Buffered Input Program Signal). The buffer circuit provides a BIPS (Buffered Input Program Signal) to the Modulator and to the Summer. The Modulator is a circuit that is coupled to receive the buffered input program signal. The Modulator generates harmonics in response to changes in amplitude of the BIPS to provide a MIPS (Modulated Input Program Signal. The Summer circuit adds the BIPS (buffered input program signal) and the MIPS (Modulated Input Program Signal) to provide a CMIPS (Composite Modulated Input Program Signal). The Pre-Amplifier is coupled to be receive the CMIPS and to provide a COS (Compensated Output Signal) that includes harmonics generated by the Harmonic Generator circuit.

BRIEF DESCRIPTION OF THE DRAWINGS

Details of the invention, and of preferred embodiments thereof, will be further understood upon reference to the drawing, wherein.

DETAILED DESCRIPTION OF PREFERRED EMBODIMENTS

Figure 1:
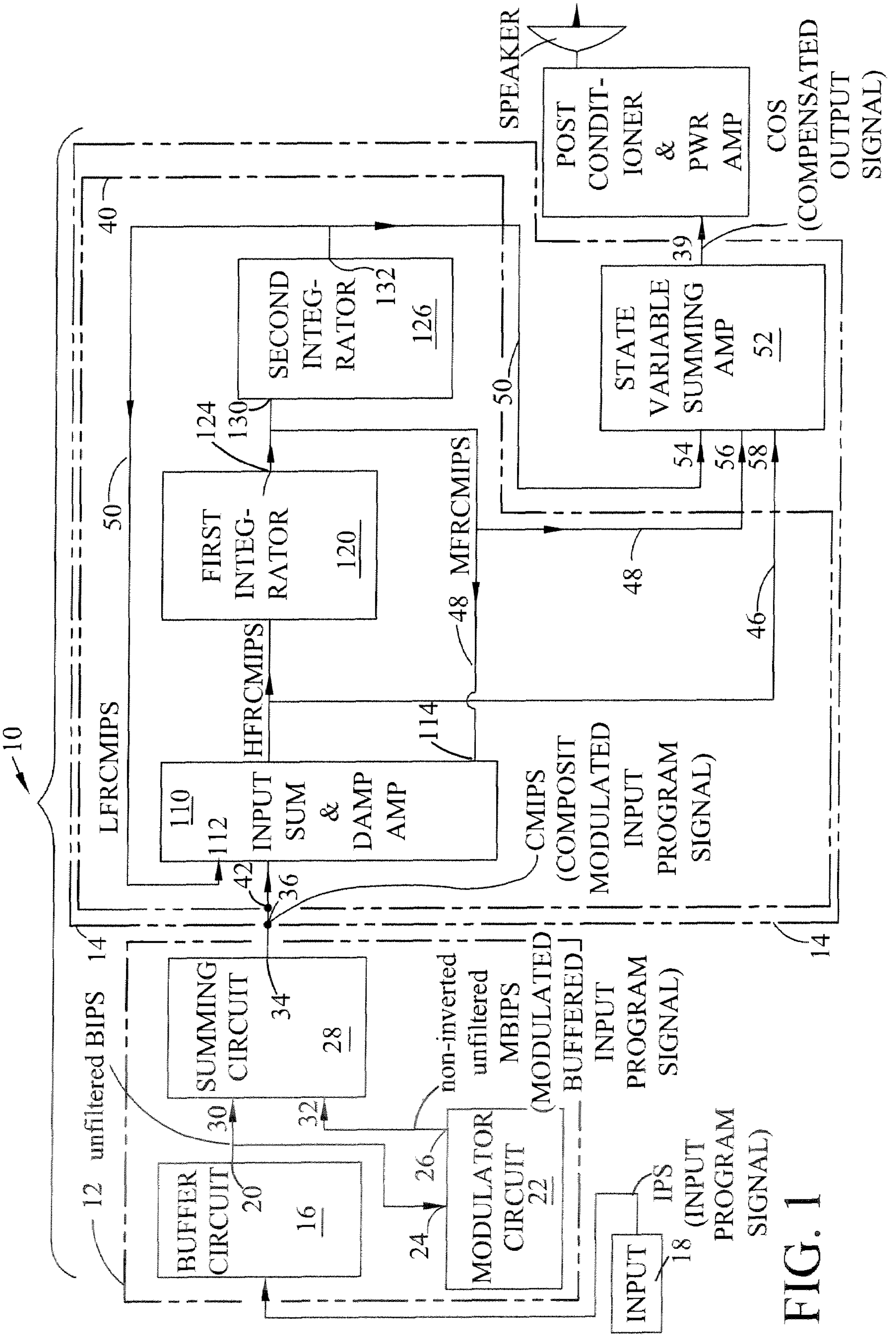
FIG. 1 is a block diagram of the Harmonic Generator And Pre-Amplifier Circuit.

FIG. 1 shows the Harmonic Generator and Pre-Amplifier Circuit 10 comprising a Harmonic Generator Circuit 12 and a Pre-Amplifier 14 A Buffer Circuit 16 is responsive to an IPS (Input Program Signal) applied to INPUT Terminal 18. The Buffer Circuit 16 buffers the IPS and provides a BIPS (Buffered Input Program Signal) at the Buffer Circuit 16 output terminal 20.

A Modulator Circuit 22 receives the BIPS at the Modulator Circuit Input terminal 24 and adds harmonics to the content of the BIPS. The Modulator Circuit 22 provides the modified BIPS as the MBIPS (Modulated Buffered Input Program Signal) at the Modulator Circuit Output Terminal 26.

A Summing Circuit 28 adds the BIPS at the Summing Circuit First input 30 and the MBIPS at Summing Circuit Second Input 32 to provide a CMIPS (Composite Modulated Input Program Signal) at the Summing Circuit Output 34.

The Pre-Amplifier 14 is coupled to receive the CMIPS at the Pre-Amplifier Input 36. The Pre-Amplifier 14 amplifies and conditions the CMIPS and outputs a COS (Composite Operating Signal) at the Pre-Amplifier Output 39.

Figure 3:
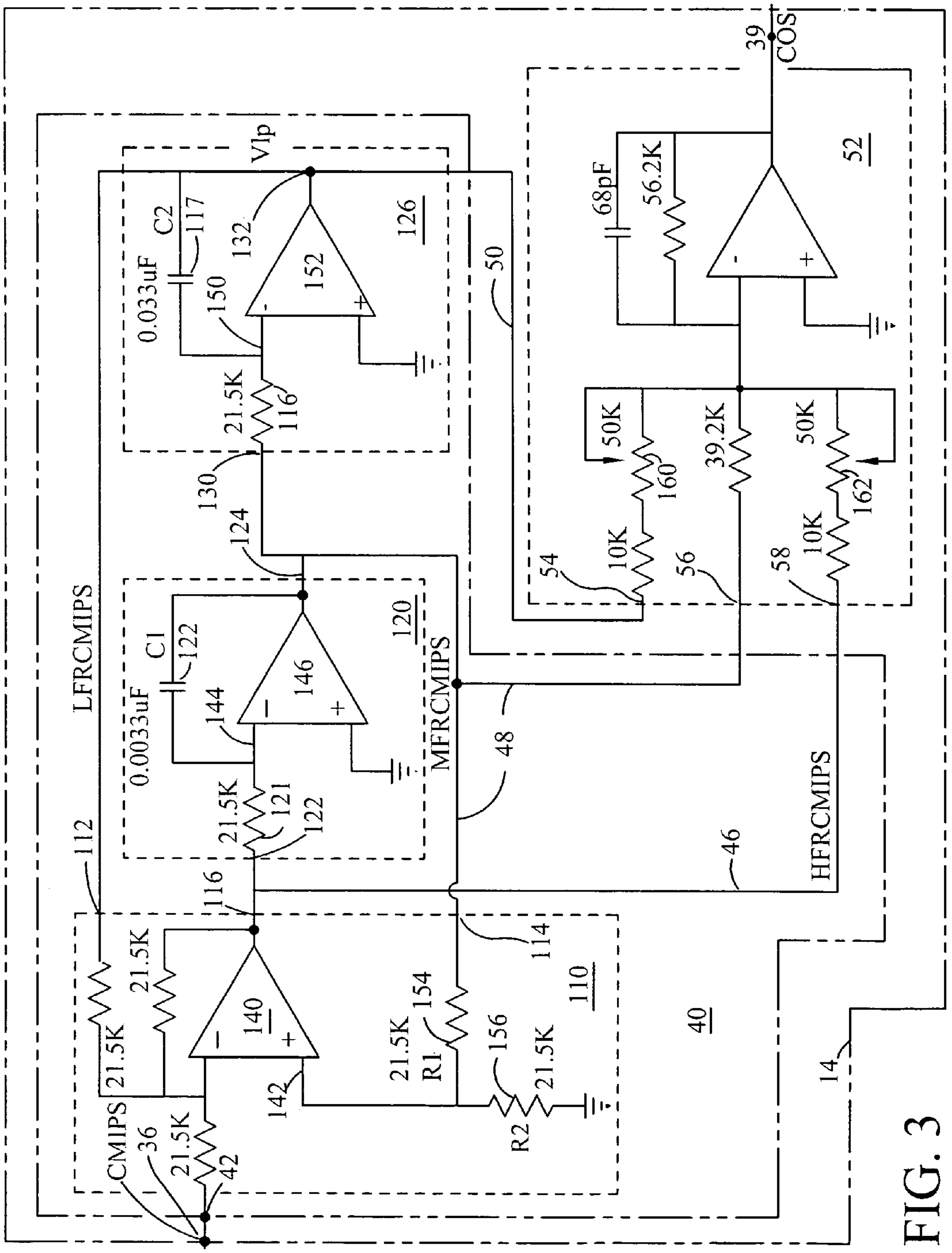
FIG. 3 is a combined block diagram and schematic of the State-Variable Pre-Amplifier Circuit.

The Pre-Amplifier 14 is further characterized in FIG. 1 and FIG. 3 as having an All-Pass State Variable Filter 40 that is coupled to receive the CMIPS at its All-Pass State Variable Filter Input 42 from the Pre-Amplifier Input 36. The Pre-Amplifier processes the CMIPS into three signals in three signal ranges. The CMIPS is processed to become a HFRCMIPS (High Frequency Range Composite Modulated Input Program Signal), an MFRCMIPS (Mid Frequency Range Composite Modulated Input Program Signal), and a LFRCMIPS (Low Frequency Range Composite Modulated Input Program Signal) shown respectively on signal lines 46, 48 and 50 within the All-Pass State Variable Filter 40.

The Pre-Amplifier 14 also includes a State-Variable Summing Amplifier 52 coupled to add the LFRCMIPS, the MFRCMIPS, and the HFRCMIPS signal components at State-Variable Summing Amplifier First, Second and Third Inputs 54, 56 and 58 respectively, to provide the COS at the Pre-Amplifier Output 39.

The Harmonic Generator Circuit

Figure 2:
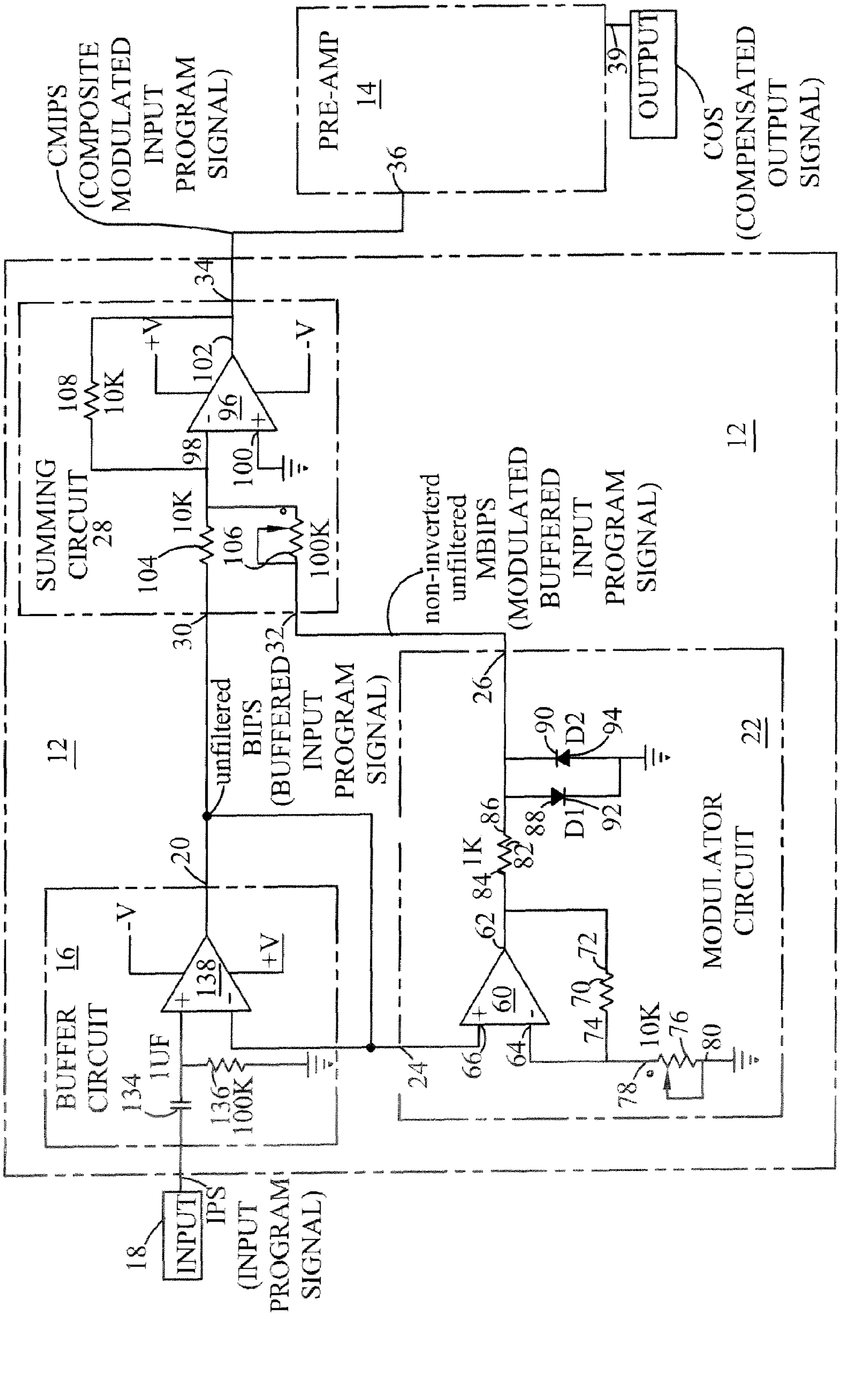
FIG. 2 is a schematic of the Harmonic Generator And Pre-Amplifier Circuit.

FIG. 2 shows that the Modulator Circuit 22 in the Harmonic Generator and Pre-Amplifier circuit 12 has an operational amplifier 60 that has an output terminal 62, an inverting input terminal 64 and a non-inverting input terminal 66. The non-inverting input terminal 66 is connected to receive the BIPS from the Modulator Circuit Input Terminal 24. A First Feed Back resistor 70 has a first terminal 72 and a second terminal 74. The first terminal 72 is connected to the amplifier output terminal 62. A second feedback resistor 76 has a first terminal 78 and a second terminal 80. The second feedback resistor first terminal 78 is connected to the first feedback resistor second terminal 74 and to the amplifier inverting input terminal 64. The second resistor second terminal 80 is coupled to ground. The second resistor 76 is manually adjustable. The amplifier provides an adjusted and scaled BIPS signal at the amplifier output terminal 62 in response to the second resistor being manually adjusted.

The Modulator Circuit 22 has a third resistor 82 that has a first end 84 coupled to the amplifier output terminal 62, and to the first feedback resistor first terminal 72. A second end 86 is connected to the common connection of anode 88 of a first diode D1 and the cathode 90 of a second diode D2. The first and second diodes D1, D2, each have a respective and opposed common cathode 92 and anode 94 coupled to ground. The connection formed by the connection of the third resistor second end 86 with the respective common anode and cathode of the first diode D1 and second diode D2 is the Modulator Output Terminal 26. The second feedback resistor 76 is manually adjusted in value to change the amplitude and the harmonic content of the MBIPS (Modulated Buffered Input Program Signal) present at the Modulator Output Terminal 26.

The Summing Circuit 28 has an operational amplifier 96 that has an inverting input 98, a non-inverting input 100 coupled to ground and an output terminal 102. A first input resistor 104, a second input resistor 106 and a feedback resistor 108 are used in the Summing Circuit 28. Each of the three resistors has a respective first end and a second end. The Summing Circuit First Input 30 is connected to the first end of the first input resistor 104. The Summing Circuit Second Input 32 is connected to the first end of the second input resistor 106. The first end of the feedback resistor 108 is connected to the Summing Circuit 28 Output Terminal 34. The second end of the first input resistor 104, the second end of the second input resistor 106 and the second end of the feedback resistor 108 are each connected to the operational amplifier inverting input 98. The operational amplifier output terminal 102 is connected to the Summing Circuit Output Terminal 34 where it outputs the analog sum of the BIPS and the MBIPS signals as the CMIPS.

The Harmonic Generator circuit 12 receives an IPS (input Program Signal) at INPUT terminal 18 from a signal source such as a CD Player, magnetic read head or a stylus on a turn table (not shown). The IPS is connected to the input of the Buffer Circuit 16 via an input decoupling capacitor 134 and resistor 136. The capacitor 134 blocks any dc component on the IPS signal input from reaching non-inverting input of operational amplifier 138.

The IPS is reproduced as the BIPS (Buffered Input Program Signal) at the Buffer Circuit output 20. The BIPS is also coupled to the Modulator Circuit 22 Input 24. The Modulator Circuit 22 responds to the BIPS and generates harmonics in the BIPS to provide the MBIPS (Modulated Buffered Input Program Signal) at the Modulator Output 26.

In some alternative embodiments, resistor 76 may be a selected value resistor might be used. The first feedback resistor 70 is shown as a fixed value feedback resistor. In other embodiments, the values of both resistors 76 and 70 are adjusted to control the positive, non-inverting gain of the amplifier. If resistor 70 is designated R70 and resistor 76 is designated R76, the gain of the amplifier stage can be shown to be approximately (R70+R76)/R76. R70 is the value of the first feedback resistor 70 and R76 is the adjusted value of the second feedback resistor 76. It should be noted that the gain of the stage increases without limit as the value of resistor 76 is adjusted to a value approaching zero. It is therefore good practice to interpose a fixed resistor having a predetermined value in series with resistor 76 to limit the maximum gain of the stage in the event that resistor 76 is inadvertently adjusted to zero. The minimum gain of the stage is two as resistor 76 is adjusted to 10K if resistor 70 also has a value of 10K ohms In operation, the series divider formed by resistors 70 and variable resistor 76 samples the buffered program IPS from the amplifier output 62. While operating in its linear range, operational amplifier 60 has an open loop gain in the hundreds of thousands, and provides an output voltage at amplifier output 62 that is sufficient to drive the voltage difference between amplifier inputs at 66 and 64 to virtually zero. Since the voltage at non-inverting input 66 is the BIPS signal level and since the amplifier will force the voltage at the inverting input 64 to be virtually equal to the voltage at the non-inverting input 66, the voltage at the operational amplifier's output 62 will be virtually equal to the voltage at the non-inverting input 66 but amplified by a factor of (R70+R76)/R76.

The output of amplifier 60 at output 62 drives the third resistor 82 which is followed by the anti-parallel or back-to-back diode clamping circuit of D1 and D2. The voltage across the diodes is an exponential relationship that depends oil the value of the forward bias current at any instant in time. At low volume, the forward bias currents are limited to levels below hard clamping. The circuit of D1 and D2 diodes operate to generate non-linear effects or harmonics as the forward bias currents passing through them is increased. The harmonics are then added back into the program signal by the Summing Circuit 28 to form the CMIPS (Composite Modulated Input Program Signal). The CMIPS is then coupled to the input of a Pre-Amplifier 14 which includes the combination of the All-Pass State-Variable Filter 40 with the State Variable Summing Amplifier 52 as shown in FIG. 3. The All-Pass State-Variable Filter 40 is characterized in U.S. Pat. No. 5,736,897.

There is a practical limit for the operation of the back to back diode clamp of D1 and D2. As the volume or amplitude of the IPS drops to a limit at which the output is difficult to hear as an output from an audio system, the importance of the modulation diminishes due to the reduced audibility of the information from the speaker or other reproduction device.

In operation, within the circuit 22, diodes D1 and D2 are typically biased past their initial point of conduction well into their nonlinear conduction range. Both forward and backward conduction is present accompanied by clamping above and below ground in response to the alternating BIPS signal driving resistor 82 to force alternating currents through the back to back diodes D1 and D2. Operation of the diodes in their initial turn on or conduction range is low at very low levels of output volume.

As the amplitude of the input signal drops to a point at which the diodes are only lightly forward biased, the result on the output is minimal. Anything above the 0.6 V across either diode produces sufficient harmonics to be of interest. Resistor R76 is adjusted to increase the gain of amplifier thereby increasing the level of the drive voltage applied to the current limiting resistor R82 at node 84 for a given level of the BIPS signal. As the diodes are driven harder into conduction, the level of harmonic richness is increased.

The clamping function of the anti-parallel diodes D1 and D2 limits the amplitude of the signal voltage that can be obtained at the Modulator Output Terminal 26 to a peak to peak value under +/−700 mV. The clamping circuit of D1 and D2 uses the third resistor 82 to limit the current through diodes D1 and D2 as each diode is driven into partial conduction as the signal voltage swings above and below ground.

R76 is typically adjusted to cause the BIPS driving R82 to have an amplitude sufficient to drive enough current through the diodes D1 and D2 to cause the forward voltage drop across each to exceed 0.6 volt. This adjustment insures the production of a CMIPS signal that is sufficiently rich in harmonics to produce the desired effect for the amplifier and speaker system that is being used. Resistor 106 is adjusted to control the signal level of the harmonics that are actually blended with the BIPS to form an acceptable CMIPS.

In operation, the characteristics of the harmonics change as the music gets louder or softer or as different selections of music are made. A user adjusts resistor 76 and resistor 106 to obtain a preferred response in real time as the music is reproduced by the system and its speaker(s). The adjustment of resistor 76 controls the amount of harmonics that are produced (the amplitude of the MBIPS) for a predetermined amplitude of the BIPS. Resistor 106 controls the amount of the harmonics that are added to the BIPS to form the CMIPS (Composite Modulated Input Program Signal) that is delivered to the input of the Pre-Amplifier within phantom block 14 in FIGS. 1 and 3. The adjustment of resistors 76 and resistor 106 is therefore empirically determined by the user to obtain his preferred setting as the user listens to the output of the speakers or headset.

The All-Pass State-Variable Pre-Amplifier

The design of an All-Pass State-Variable Pre-Amplifier 14 composed of the All-Pass Variable Filter 40 and a State-Variable Summing Amplifier 52 is characterized in U.S. Pat. No. 5,736,897 which is referenced above. The '897' patent provides a detailed and design procedure and schematic for the All-Pass State-Variable Pre-Amplifier 14.

Referring now to FIG. 3, the All-Pass State Variable Filter 40 is further characterized as having an Input Summing And Damping Amplifier 110. The Input Summing And Damping Amplifier 110 has a first input coupled to receive the CMIPS from the Pre-Amplifier Input 36 via State Variable Filter input 42. A second input 112 is coupled to receive the LFRCMIPS on signal line 50 and a third input 114 coupled to receive the MFRCMIPS from signal line 48. The Input Summing And Damping Amplifier 110 also has an output 116 which outputs the HFRCMPS signal on signal line 46.

In a more detailed embodiment, the All-Pass State Variable Filter 40 in the Pre-Amplifier 14, is further characterized as having a First Integrator 120 having an input 122 coupled to receive the HFRCMIPS from the Input Summing And Damping Amplifier output 116. The First Integrator has an Output 124 that provides the MFRCMIPS to the input 114 of the Input Summing And Damping Amplifier 110.

A Second Integrator 126 has an input 130 that is coupled to receive the MFRCMIPS from the First Integrator Output 124. The Second Integrator 126 also has an Output 132 that outputs the LFRCMIPS onto signal line 50. The State-Variable Summing Amplifier First Input 54 is connected to receive the LFRCMIPS from signal line 50. The Second Input 56 is connected to receive the MFRCMIPS from signal line. 48. The Third Input 58 is connected to receive the HFRCMIPS from signal line 46. The State-Variable Summing Amplifier 52 adds the respective LFRCMIPS, the MFRCMIPS and the HFRCMIPS to provide the State-Variable Summing Amplifier Output 39. The MFRCMIPS is inverted in phase with respect to the HFRCMIPS and the LFRCMIPS signal components due to the inversion of the signals provided by the operational amplifiers used in the All-Pass State Variable Filter 40.

The Input Summing And Damping Amplifier circuit 110 has a portion of the mid-range band-pass signal MFRCMIPS fed to the non-inverting input 142 of amplifier 140 for damping. The output of amplifier 140 is the HFRCMIPS which is coupled to the negative input 144 of a second operational amplifier 146 within First Integrator 120. The first integrator 120 inverts and integrates the HFRCMIPS. The HFRCMIPS is then coupled to the State-Variable Summing Amplifier 52 high pass input 54 via signal line 46.

The first integrator 120 integrates the HFRCMIPS signal to provide the mid-range band-pass signal MFRCMIPS at first integrator output 124. The mid-range band-pass signal MFRCMIPS is fed to the damping input 114 of the Input Summing And Damping Amplifier circuit 110 and to the mid-range band-pass input, the second input, 56 of the Summing Amplifier 52 on signal line 48 and via resistor 116 to the negative input 150 of a third operational amplifier 152 in the Second Integrator 126.

The Second Integrator 126 responds to the mid-range band-pass signal MFRCMIPS on signal line 48 and provides a low band-pass signal LFRCMIPS at the second integrator output terminal 132 to the State-Variable Summing Amplifier 52 low band-pass signal input, the first input, 54 and to the second input 112 of the input Summing And Damping Amplifier Circuit 110 via signal line 50.

The damping circuit of the Input Summing And Damping Amplifier Circuit 110 comprises an input resistor 154 that has a first terminal connected to receive the mid-range band-pass signal at damping input 114. The second terminal of resistor 154 is coupled to the first terminal of resistor 156 and to the non-inverting input of operational amplifier 140. The second terminal of resistor 156 is coupled to a reference ground. The ratio of resistors 154 and 156 establish the "Q" of the state-variable filter. The higher the ratio of the resistors 74 and 76, the higher the Q. The Q of the All-Pass State-Variable Pre-Amplifier 14 of FIGS. 1, 2 and 3 is typically in the range of 0.5 to 2 for audio applications.

One of the objectives of the state-variable filter is to set the phase shift and gains up such that the mid-range band-pass frequency signals are about 180 degrees out of phase with the signal components in the lower frequency band and in the higher-frequency band. The ratio of the damping resistors, the gains and break frequencies of the amplifiers and integrator are set for a desired Q and band-pass.

The State-Variable Summing Amplifier 52 has a low frequency band-pass gain adjustment resistor 160, and a high range band-pass frequency gain adjustment pot 162 that permit the user to make a final adjustment for a particular circuit and component configuration. The adjustable inputs to the State-Variable Summing Amplifier 52 permit the user to control the gain for the LFRCMIPS and HFRCMIPS signal.

The circuit of the State Variable Pre-Amp of FIGS. 1 and 3 can be adjusted to obtain a total of 360 degrees of phase shift of the high frequency signal components of the CMIPS with respect to the low frequency signal components of the input program signal, in frequency space over the range of 0 to 20,000 Hz. The high frequency components gain 360 degrees of phase shift with respect to the low frequency components.

The All-Pass State-Variable Pre-Amplifier 14 also provides a time delay that is adjusted to obtain about 2.5 ms time delay at 20 Hz. The 20 Hz components are physically delayed in real time by up to 2.5 ms with respect to the high frequency components. The design objectives for audio applications are taught in U.S. Pat. No. 4,638,258 issued on Jan. 20, 1987 for a Reference Load Amplifier Correction System, to Robert C. Crooks.

Referring again to FIG. 3, and to a reactance chart, a check will show the break frequency for the mid-range band-pass amplifier 146 to be about 2.24 KHz. The break frequency for the low range band-pass amplifier 152 is about a decade lower at 224 Hz at three dB per octave. The Q of the circuit of FIG. 3 is approximated by the following equation:

$$Q=(R1+R2)/3R2=0.67 \quad \text{Eq. 1}$$

where R1 is resistor 154 and R2 is resistor 156 in FIG. 3.

Viewing the circuit heuristically, the higher reactance of the smaller capacitance for mid-range band-pass amplifier (C1=0.0033 μF), capacitor 122 within the first integrator 120 sets the gain of the amplifier to higher values at lower frequencies than that of the low range band-pass amplifier within the second integrator 126 (capacitance C2=0.033 μF), capacitor 117. It can also be seen that the mid-range band-pass amplifier of first integrator 120 is a single pole filter. The feed back signal MFRCMIPS to the damping resistors results in a controlled Q in the mid-range frequencies band In general, the Q of a band-pass filter is defined as the bandwidth divided by the center frequency. The design of the state-variable filter of FIG. 3 is taught in the text "The Active Filter Handbook" by Frank P. Tedeschi, pg 178-182, Tab Books Inc. or Blue Ridge Summit, Pa., 17214; however, this reference does not show the outputs being summed to form the desired unbalanced output that meets the desired requirement for audio applications.

The object of the design of the All-Pass State-Variable Pre-Amplifier 14 of FIGS. 1, 2 and 3 is to have a first break frequency at approximately 240 Hz and a second at 2.24 KHz, about a decade away from the first break. The low break $f_c$ is established by the equation:

$$f_c=1/2\pi RC2 \quad \text{Eq. 2}$$

where R and C are the value of resistor 116 and capacitor 117. The high frequency break is set by the $$f_c=1/2\pi RC1 \quad \text{Eq. 3}$$

where the value of R and C1 are those of resistor 121 and capacitor 122.

Once the Q is selected, the ratio of resistor 154 to resistor 156 can be calculated from the equation. In the case of the All-Pass State-Variable Pre-Amplifier of FIGS. 2 and 3, a Q of 0.67 was selected by knowing what the desired gain bandwidth response curve would be from the above referenced U.S. Pat. No. 4,638.258. The circuit was modeled using a computer aided analysis program such as SPICE. The break frequencies were estimated from the information in the referenced U.S. Pat. No. 4,638,258. Initial component values were selected based oil available components. A reactance chart can be used for a quick approximation of the required remaining value once one of the values are known. The circuit shown had an initial goal of a center frequency at 700 Hz. At the center frequency, the gain of the circuit is about −1 dB or less than 1. The two adjustment pots, for variable resistors 160 and 162 permit an adjustment of the gain of the LFRCMIPS and the HFRCMIPS by about 15 dB with the values shown.

The Q was then adjusted using the pots for the variable resistors 160 and 162 to provide the best match to the curves in the earlier patent to Crook. The Q and the break points were selected to match the response characteristic of the resulting circuit to the curves in the earlier patent to yield the same phase shifts, time delays and frequency response. The resistors 70 and 76 are set for a gain of nine but a slightly higher gain of 12 would be preferred.

The outputs HFRCMIPS, MFRCMIPS and LFRCMIPS of the state-variable filer 40 represent three independent state variables. The procedure for adjusting the band-pass and gain as proposed in the above referenced text "The Active Filter Handbook" by Frank P. Tedeschi, at pages 178-182 is to set the value of C1 and C2 to be equal and to adjust the ratio of R1 and R2 and to obtain the desired Q. In addition, in the circuit of FIG. 3, the State-Variable Summing Amplifier 52 provides gain pot R162 for the control of the HFRCMIPS signal and gain control pot resistor 160 for the control of the LFRCMIPS signal. These two pots provide for independent control of the gain and band-pass of signals processed by the state variable filter. The amount of the harmonics produced and the amount that is blended into the CMIPS is controlled by pot R106 shown within summing circuit 29.

Figure 4A:
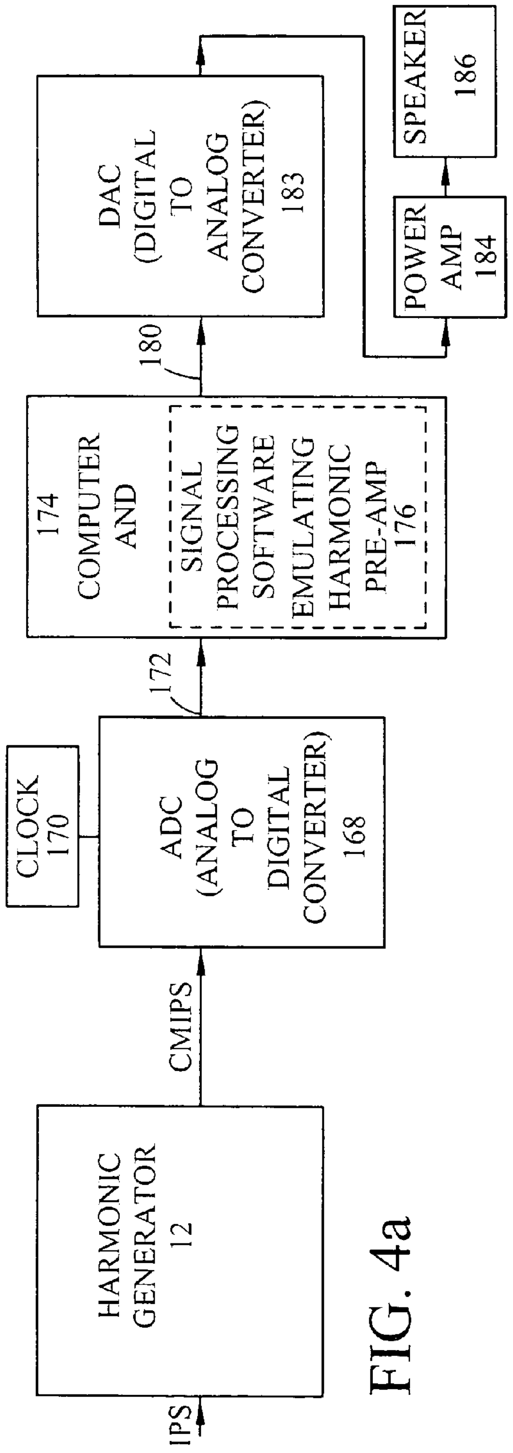
FIGS. 4*a* and 4*b* are schematic block diagrams of an embodiment using signal processing software and or hardware to perform the function of the Harmonic Generator and Pre-Amplifier Circuit.

FIG. 4*a* shows a digital signal processing alternative to the analog process of FIGS. 1, 2 and 3 for processing the IPS signal. The IPS is processed by the Harmonic Generator 12 to provide an analog CMIPS which is then coupled to an ADC (Analog to Digital Converter) 168. The ADC 168 samples a continuous series of instantaneous values of the CMIPS signal and provides a digital value for each sample. The sample rate is determined by a clock input from Clock 170. A minimum clock rate is typically 44 KHs. Conventional off the shelf ADCs can be clocked at twice that rate and higher rates are possible. The sampled values, are transferred to a buss 172 from which the values are transferred at interrupt times by computer 174 running signal processing software 176. The signal processing software 176 is tailored to perform the function of the All-Pass State-Variable Filter 40 and the State-Variable Summing Amplifier 52 shown in FIGS. 1 and 3. The development of software and hardware such as LSI devices is typically outsourced to software and component providers which will provide the software and or hardware as a proprietary component from the specifications outlined for the analog equivalents.

Figure 4B:
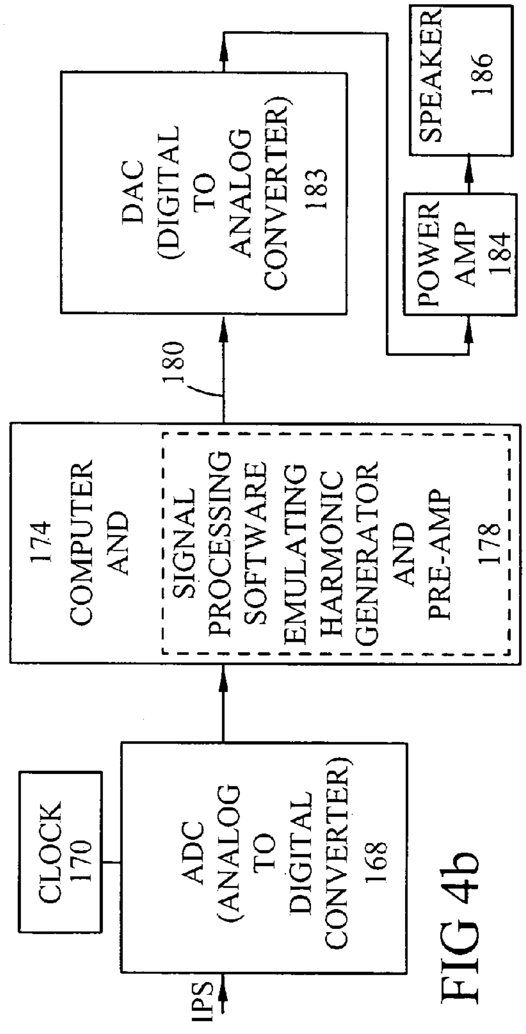

In the alternative, FIG. 4*b* shows an alternative embodiment that eliminates the analog version of the Harmonic Generator 12. The specification of the Harmonic Generator 12 would be added to the requirement for the software and or hardware to be developed thereby simplifying the product to be designed. The signal processing hardware and or software in FIG. 4*b* is represented by phantom block 178 and is distinguished from the signal processing hardware and or software in FIG. 4*a* which is represented by phantom block 176.

In the embodiments of both FIGS. 4*a* and 4*b*, the Computer and or software would output the emulated data on digital bus 180 to DAC (Digital To Analog Converter) 183 and then to power amplifier 184 for delivery to speaker 186. If a clock is required for the operation of the DAC, it could be provided by clock 170 or by the computer as an enable signal.

While certain specific relationships, materials and other parameters have been detailed in the above description of preferred embodiments, those can be varied, where suitable, with similar results. Other applications, and variation of the present invention will occur to those skilled in the art upon reading the present disclosure. Those variations are also intended to be included within the scope of this invention as defined in the appended claims.

What is claimed is:

1. A harmonic generator and pre-amplifier circuit comprising:

a modulator circuit coupled to receive an unfiltered BIPS (Buffered Input Program Signal) for generating harmonics and for providing a non-inverted and unfiltered MBIPS (Modulated Buffered Input Program Signal), a summing circuit for adding the BIPS and the MBIPS to provide a CMIPS (Composite Modulated Input Program Signal), and a pre-amplifier coupled to receive, to amplify and to condition the CMIPS to provide a COS (Composite Operating Signal), wherein the pre-amplifier comprises:

an all-pass state variable filter coupled to receive the CMIPS and for providing a HFRCMIPS (High-Frequency Range Composite Modulated Input Program Signal), an MFRCMIPS (Mid-Frequency Range Composite Modulated Input Program Signal), and a LFRCMIPS (Low-Frequency Range Composite Modulated Input Program Signal), and a state-variable summing amplifier coupled to add the HFRCMIPS, the MFRCMIPS, and the LFRCMIPS to provide the COS.

2. The harmonic generator and pre-amplifier circuit of claim 1 wherein an IPS (Input Program Signal) is provided as an input thereto and wherein said modulator circuit further comprises a buffer circuit for receiving said IPS signal for buffering said IPS signal and for providing said unfiltered BIPS.

3. The harmonic generator and pre-amplifier circuit of claim 2 wherein said buffer circuit comprises:

a non-inverting follower circuit coupled to receive the IPS and to provide the unfiltered BIPS to the modulator circuit and to the summer circuit.

4. A harmonic generator and pre-amplifier circuit comprising:

a modulator circuit coupled to receive a BIPS (Buffered Input Program Signal) for generating harmonics and for providing a MBIPS (Modulated Buffered Input Program Signal), a summing circuit for adding the BIPS and the MBIPS to provide a CMIPS (Composite Modulated Input Program Signal), and a pre-amplifier coupled to receive, to amplify and to condition the CMIPS to provide a COS (Composite Operating Signal), wherein an IPS (Input Program Signal) is provided as an input thereto and said harmonic generator and pre-amplifier circuit further comprising a buffer circuit for receiving said IPS signal for buffering said IPS signal and providing said BIPS, and wherein the modulator circuit further comprises:

an amplifier having an output terminal, an inverting input terminal and a non-inverting input terminal coupled to the BIPS, a first feed back resistor having a first terminal and a second terminal, the first terminal being coupled to the amplifier output terminal, a second feedback resistor having a first terminal and a second terminal, the first terminal being connected to the first feedback resistor second terminal and to the amplifier inverting input terminal, the second resistor second terminal being coupled to ground, the second resistor being manually adjustable, the amplifier output terminal providing an adjusted and scaled BIPS signal at its output terminal in response to the second resistor being manually adjusted.

5. The harmonic generator and pre-amplifier circuit of claim 4 wherein the modulator circuit further comprises:

a third resistor having a first end coupled to the amplifier output terminal, and a second end coupled to a common anode and cathode of a first and second diode respectively, the first and second diode having an opposed common cathode and anode coupled to ground, a terminal formed by the connection of the third resistor second end with the common anode and cathode of the first and second diode being an output terminal of the modulator circuit, the second feedback resistor being manually adjusted in value to change amplitude and harmonic content of the MBIPS (Modulated Buffered Input Program Signal) present at the modulator output terminal.

6. A harmonic generator and pre-amplifier circuit comprising:

a modulator circuit coupled to receive a BIPS (Buffered Input Program Signal) for generating harmonics and for providing a MBIPS (Modulated Buffered Input Program Signal), a summing circuit for adding the BIPS and the MBIPS to provide a CMIPS (Composite Modulated Input Program Signal), and a pre-amplifier coupled to receive, to amplify and to condition the CMIPS to provide a COS (Composite Operating Signal), wherein the summing circuit further comprises:

a summing circuit first input coupled to receive the BIPS, a summing circuit second input coupled to receive the MBIPS, a summing circuit output terminal to output the CMIPS, an operational amplifier including:

an inverting input, a non-inverting input coupled to ground, and a first input resistor, a second input resistor and a feedback resistor, each resistor having a respective first and second end, the summing circuit first input being coupled to the first input resistor first end, the summing circuit second input being coupled to the second input resistor first end, the feedback resistor first end being connected to the summing circuit output terminal, the first input resistor second end, the second input resistor second end and the feedback resistor second end each being connected to the operational amplifier inverting input, the operational amplifier output terminal being coupled to the summing circuit output terminal to output the analog sum of the BIPS and the MBIPS signals to provide the CMIPS at the summing circuit output terminal.

7. The harmonic generator and pre-amplifier circuit of claim 1 wherein the pre-amplifier further comprises:

an input summing and damping amplifier having a first input coupled to receive the CMIPS, a second input coupled to receive the LFRCMIPS, a third input coupled to receive the MFRCMIPS, the input summing and damping amplifier also having an output to provide the HFRCMPS.

8. The harmonic generator and pre-amplifier circuit of claim 1 wherein the pre-amplifier further comprises:

an input summing and damping amplifier having a first input coupled to receive the CMIPS, a second input coupled to receive the LFRCMIPS, a third input coupled to receive the MFRCMIPS, the input summing and damping amplifier also having an output to provide the HFRCMIPS, a first integrator having an input coupled to receive the HFRCMIPS from the input summing and damping amplifier output, the first integrator having an output providing the MFRCMIPS to the input summing and damping amplifier, a second integrator having an input coupled to receive the MFRCMIPS from the first integrator output, the second integrator having an output providing the LFRCMIPS, and the state-variable summing amplifier having a first input coupled to receive the LFRCMIPS, a second input coupled to receive the MFRCMIPS and a third input coupled to receive the HFRCMIPS, the state-variable summing amplifier adding the respective LFRCMIPS, the MFRCMIPS and the HFRCMIPS to provide the COS at its output.

9. The harmonic generator and pre-amplifier circuit of claim 8 wherein the MFRCMIPS is inverted in phase with respect to the HFRCMIPS and the LFRCMIPS signal components.

10. A harmonic generator and pre-amplifier circuit comprising:

a buffer circuit connected to receive an input program signal for buffering the input program signal and for providing an unfiltered BIPS (Buffered Input Program Signal), a modulator circuit connected to the unfiltered BIPS for generating harmonics and for providing a non-inverted and unfiltered MBIPS (Modulated Buffered Input Program Signal) with manually adjustable harmonic content, a summing circuit for adding the BIPS and the MBIPS to provide a CMIPS (Composite Modulated Input Program Signal) characterized as having high, low and mid-range frequency signal components, an all-pass state-variable filter having an input coupled to receive and process the CMIPS, into three signal frequency ranges which include;

a HFRCMPS (High Frequency Range Composite Modulated Input Program Signal), an MFRCMIPS (Mid-Frequency Range Composite Modulated Input Program Signal), and a LFRCMIPS (Low-Frequency Range Composite Modulated Input Program Signal), and a state-variable summing amplifier coupled to add the HFRCMIPS, the MFRCMIPS, and the LFRCMIPS to provide a COS (Composite Output Signal).

11. The harmonic generator and pre-amplifier circuit of claim 10 wherein the buffer circuit further comprises:

a non-inverting follower circuit coupled to receive the IPS and to provide the unfiltered BIPS to the modulator circuit and to the summer circuit.

12. The harmonic generator and pre-amplifier circuit of claim 10 wherein the modulator circuit further comprises:

an amplifier having an output terminal, an inverting input terminal and a non-inverting input terminal connected to receive the unfiltered BIPS, a first feed back resistor having a first terminal and a second terminal, the first terminal being coupled to the amplifier output terminal, a second feedback resistor having a first terminal and a second terminal, the first terminal being connected to the first feedback resistor second terminal to the amplifier inverting input terminal, the second resistor second terminal being coupled to ground, the second resistor being manually adjustable, the amplifier output terminal providing an adjusted and scaled non-inverted and unfiltered BIPS signal at its output terminal in response to the second resistor being manually adjusted.

13. The harmonic generator and pre-amplifier circuit of claim 12 wherein the modulator circuit further comprises:

a third resistor having a first end coupled to the amplifier output terminal to receive the scaled non-inverted and unfiltered BIPS, and a second end coupled to a common anode and cathode of a first and second diode respectively, the first and second diode having an opposed common cathode and anode coupled to ground, a terminal formed by the connection of the third resistor second end with the common anode and cathode of the first and second diode being an output terminal of the modulator circuit, the second feedback resistor being manually adjusted in value to change amplitude and harmonic content of the non-inverted and unfiltered MBIPS (Modulated Buffered Input Program Signal) present at the modulator output terminal.

14. The harmonic generator and pre-amplifier circuit of claim 10 wherein the summing circuit comprises:

a summing circuit first input coupled to receive the unfiltered BIPS, a summing circuit second input coupled to receive the non-inverted and unfiltered MBIPS, a summing circuit output terminal to output the CMIPS, an operational amplifier including:

an inverting input, a non-inverting input coupled to ground, and a first input resistor, a second input resistor and
a feedback resistor,
each resistor having a respective first and second end,
the summing circuit first input being coupled to the first input resistor first end, the summing circuit second input being coupled to the second input resistor first end,
the feedback resistor first end being connected to the summing circuit output terminal,
the first input resistor second end, the second input resistor second end and the feedback resistor second end each being connected to the operational amplifier inverting input,
the operational amplifier output terminal being coupled to the summing circuit output terminal to output the analog sum of the unfiltered BIPS and the non-inverted and unfiltered MBIPS signals to provide the CMIPS at the summing circuit output terminal.

15. The harmonic generator and pre-amplifier circuit of claim 10 wherein the all-pass state-variable filter further comprises:
a first amplifier stage responsive to the CMIPS for providing the HFRCMIPS,
a second amplifier stage responsive to an output of the first amplifier stage for providing the MFRCMIPS;
a third amplifier stage for providing the LFRCMIPS, and
a summing amplifier for adding the HFRCMIPS, the MFRCMIPS and the LFRCMIPS provide the COS.

16. The harmonic generator and pre-amplifier circuit of claim 10 wherein the MFRCMIPS is inverted in phase with respect to the HFRCMIPS and the LFRCMIPS signal components.

17. A harmonic generator and pre-amplifier circuit comprising:
a buffer circuit having an input responsive to an input program signal for buffering the input program signal and an output, the buffer circuit being characterized to provide a BIPS (Buffered Input Program Signal) to its output,
a modulator having
a non-inverting follower circuit comprising:
an amplifier having
an output terminal,
an inverting input terminal and
a non-inverting input terminal coupled to be responsive to the BIPS, a first feed back resistor having
a first terminal and
a second terminal, the first terminal being coupled to the amplifier output terminal,
a second feedback resistor having
a first terminal and
a second terminal connected to the first resistor second terminal and to the amplifier inverting input, the second resistor second terminal being manually adjustable and coupled to ground,
a third resistor having a first terminal coupled to the amplifier output terminal, and a second end coupled to the common anode and cathode of a first and second diode, the first and second diode having a respective common cathode and anode coupled to ground, the terminal formed by the connection of the third resistor second end with the common anode and cathode of the first and second diode forming the modulator output terminal, the second feedback resistor being adjusted in value to change an amplitude of the MBIPS (Modulated Buffered Input Program Signal) present at the modulator output terminal,
a summing circuit for adding the BIPS (Buffered Input Program Signal) and the MBIPS (Modulated Buffered Input Program Signal) to provide a CMIPS (Composite Modulated Input Program Signal),
an all-pass state-variable filter having
an input summing and damping amplifier having a first input coupled to receive the CMIPS, a second input coupled to receive the LFRCMIPS, a third input coupled to receive the MFRCMIPS, the input summing and damping amplifier also having an output to provide the HFRCMIPS,
a first integrator having an input coupled to receive the HFRCMIPS from the input summing and damping amplifier output, the first integrator having an output providing the MFRCMIPS to the input summing and damping amplifier,
a second integrator having an input coupled to receive the MFRCMIPS from the first integrator output, the second integrator having an output providing the LFRCMIPS, and
the state-variable summing amplifier having a first, a second and a third input, the state-variable summing amplifier first input being coupled to receive the LFRCMIPS, the second input being coupled to receive the MFRCMIPS and the third input being coupled to receive the HFRCMIPS, the state-variable summing amplifier adding the respective LFRCMIPS, the MFRCMIPS and the HFRCMIPS to provide the COS at its output.

18. The harmonic generator and pre-amplifier circuit of claim 17 wherein the all-pass state-variable pre-amplifier first integrator inverts the MFRCMIPS signal in phase with respect to the HFRCMIPS signal and the LFRCMIPS signal components.

* * * * *